(12) United States Patent
Kim et al.

(10) Patent No.: US 10,103,109 B2
(45) Date of Patent: Oct. 16, 2018

(54) SEMICONDUCTOR DEVICE, SEMICONDUCTOR CHIP AND METHOD OF MANUFACTURING THE SEMICONDUCTOR DEVICE

(71) Applicant: SAMSUNG ELECTRONICS CO., LTD., Suwon-si (KR)

(72) Inventors: Sun-dae Kim, Hwaseong-si (KR); Hyung-gil Baek, Suwon-si (KR); Yun-rae Cho, Suwon-si (KR); Nam-gyu Baek, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 19 days.

(21) Appl. No.: 15/448,215

(22) Filed: Mar. 2, 2017

(65) Prior Publication Data
US 2017/0317035 A1 Nov. 2, 2017

(30) Foreign Application Priority Data
Apr. 27, 2016 (KR) .................. 10-2016-0051528

(51) Int. Cl.
*H01L 23/00* (2006.01)
*H01L 23/58* (2006.01)
*H01L 21/78* (2006.01)

(52) U.S. Cl.
CPC ............ *H01L 23/562* (2013.01); *H01L 21/78* (2013.01); *H01L 23/585* (2013.01); *H01L 2224/16225* (2013.01); *H01L 2924/181* (2013.01)

(58) Field of Classification Search
CPC ..................................................... H01L 23/562
See application file for complete search history.

(56) References Cited

U.S. PATENT DOCUMENTS

| | | | |
|---|---|---|---|
| 5,831,330 A | * | 11/1998 | Chang .................. H01L 23/585 257/620 |
| 7,777,304 B2 | | 8/2010 | Hamatani et al. |
| 7,888,237 B2 | | 2/2011 | Kim et al. |
| 7,994,613 B2 | | 8/2011 | Jung |

(Continued)

FOREIGN PATENT DOCUMENTS

| | | |
|---|---|---|
| JP | 2007-67372 A | 3/2007 |
| JP | 2011-134893 A | 7/2011 |

(Continued)

*Primary Examiner* — William Harriston
(74) *Attorney, Agent, or Firm* — Sughrue Mion, PLLC

(57) ABSTRACT

Provided is a semiconductor device including a semiconductor substrate including a main chip area and a scribe lane area adjacent to the main chip area, the scribe lane area including a first region adjacent to the main chip area and a second region adjacent to the first region; an insulating layer disposed on the semiconductor substrate; first embossing structures disposed on a first surface of the insulating layer in a first area of the insulating layer corresponding to the first region; second embossing structures disposed on the first surface of the insulating layer in a second area of the insulating layer corresponding to the second region; and dam structures provided in the first area of the insulating layer at positions corresponding to the first embossing structures, the dam structures extending in a direction perpendicular to a second surface of the insulating layer that is adjacent to the semiconductor substrate.

19 Claims, 26 Drawing Sheets

(56) References Cited

U.S. PATENT DOCUMENTS

| | | | |
|---|---|---|---|
| 8,125,053 B2* | 2/2012 | West | H01L 21/78 257/620 |
| 8,354,735 B2 | 1/2013 | Lee et al. | |
| 8,368,180 B2 | 2/2013 | Yu et al. | |
| 8,623,743 B2* | 1/2014 | Lee | H01L 23/562 438/454 |
| 8,648,444 B2 | 2/2014 | Chen et al. | |
| 8,786,055 B2 | 7/2014 | Kawashima | |
| 9,117,831 B2* | 8/2015 | Yang | H01L 23/564 |
| 9,679,896 B2* | 6/2017 | Yoon | H01L 27/0886 |
| 9,905,465 B2* | 2/2018 | Ning | H01L 21/76897 |
| 2002/0024115 A1* | 2/2002 | Ibnabdeljalil | H01L 23/562 257/620 |
| 2003/0218254 A1* | 11/2003 | Kurimoto | H01L 21/76807 257/758 |
| 2009/0108409 A1* | 4/2009 | Tsutsue | H01L 21/768 257/618 |
| 2009/0134496 A1 | 5/2009 | Warrick et al. | |
| 2010/0025824 A1* | 2/2010 | Chen | H01L 23/585 257/620 |
| 2011/0057297 A1* | 3/2011 | Lee | H01L 23/562 257/620 |
| 2011/0156219 A1 | 6/2011 | Kawashima et al. | |
| 2014/0284670 A1 | 9/2014 | Kawashima | |
| 2015/0061080 A1 | 3/2015 | Lee | |

FOREIGN PATENT DOCUMENTS

| | | |
|---|---|---|
| KR | 10-2007-0078589 A | 8/2007 |
| KR | 10-0817402 B1 | 3/2008 |
| KR | 10-0870602 B1 | 11/2008 |
| KR | 10-2009-0046993 A | 5/2009 |
| KR | 10-2011-0060809 A | 6/2011 |
| KR | 10-2013-0011386 A | 1/2013 |
| KR | 10-1349174 B1 | 1/2014 |
| KR | 10-1440308 B1 | 9/2014 |
| KR | 10-2015-0025802 A | 3/2015 |
| KR | 10-1581431 B1 | 12/2015 |

* cited by examiner

SEMICONDUCTOR DEVICE, SEMICONDUCTOR CHIP AND METHOD OF MANUFACTURING THE SEMICONDUCTOR DEVICE

CROSS-REFERENCE TO RELATED APPLICATION

This application claims priority from Korean Patent Application No. 10-2016-0051528, filed on Apr. 27, 2016 in the Korean Intellectual Property Office, the disclosure of which is incorporated herein in its entirety by reference.

BACKGROUND

Apparatuses and methods consistent with exemplary embodiments relate to a semiconductor device, a semiconductor chip, and a method of manufacturing the semiconductor device.

A semiconductor chip may be fabricated using a die-sawing process for cutting a semiconductor wafer on which integrated chips are formed. During a die-sawing process, a saw blade cuts the semiconductor wafer along with a scribe lane region to physically separate a plurality of semiconductor chips.

As integrated circuit devices that have large capacity and are highly integrated have been required, an area occupied by the scribe lane region on the semiconductor wafer is being reduced, and risk of damaging integrated circuits is increasing due to stress applied to semiconductor devices during the die-sawing process.

SUMMARY

One or more exemplary embodiments provide a semiconductor device capable of preventing stress generated during a die-sawing process from being transferred to integrated circuits.

Further, one or more exemplary embodiments provide a semiconductor chip having an improved reliability.

Further still, one or more exemplary embodiments provide a method of manufacturing a semiconductor device, capable of preventing stress generated during a die-sawing process from being transferred to integrated circuits.

According to an aspect of an exemplary embodiment, there is provided a semiconductor device including: a semiconductor substrate including a main chip area and a scribe lane area adjacent to the main chip area, the scribe lane area including a first region adjacent to the main chip area and a second region adjacent to the first region; an insulating layer disposed on the semiconductor substrate; first embossing structures disposed on a first surface of the insulating layer in a first area of the insulating layer corresponding to the first region of the scribe lane area; second embossing structures disposed on the first surface of the insulating layer in a second area of the insulating layer corresponding to the second region of the scribe lane area; and dam structures provided in the first area of the insulating layer at positions corresponding to the first embossing structures, the dam structures extending in a direction perpendicular to a second surface of the insulating layer that is adjacent to the semiconductor substrate.

According to an aspect of another exemplary embodiment, there is provided a semiconductor device including: a semiconductor substrate including a main chip area and a scribe lane area adjacent to the main chip area; an insulating layer disposed on the semiconductor substrate; embossing structures disposed on a first surface of the insulating layer in an area of the insulating layer corresponding to the scribe lane area; and wherein trenches are provided in the first surface of the insulating layer between adjacent embossing structures.

According to an aspect of another exemplary embodiment, there is provided a semiconductor device including: a semiconductor substrate comprising a main chip area and a scribe lane area adjacent to the main chip area, the scribe lane area comprising a first region adjacent to the main chip area and a second region adjacent to the first region; an insulating layer disposed on the semiconductor substrate; first embossing structures disposed on a first surface of the insulating layer in a first area of the insulating layer corresponding to the first region of the scribe lane area; and second embossing structures disposed on the first surface of the insulating layer in a second area of the insulating layer corresponding to the second region of the scribe lane area, wherein each of the first embossing structures have a first shape, each of the second embossing structures have a second shape, and the first shape is different from the second shape.

BRIEF DESCRIPTION OF THE DRAWINGS

Exemplary embodiments will be more clearly understood from the following detailed description taken in conjunction with the accompanying drawings in which:

FIGS. 1A to 1C are diagrams of a semiconductor device according to an exemplary embodiment, wherein FIG. 1A is a schematic plan view of a semiconductor device according to an exemplary embodiment, FIG. 1B is a schematic plan view showing an enlarged view of a region denoted by "S" in FIG. 1A, and FIG. 1C is a schematic cross-sectional view of the semiconductor device taken along a line A-A' of FIG. 1B;

DETAILED DESCRIPTION

Figure 1A:
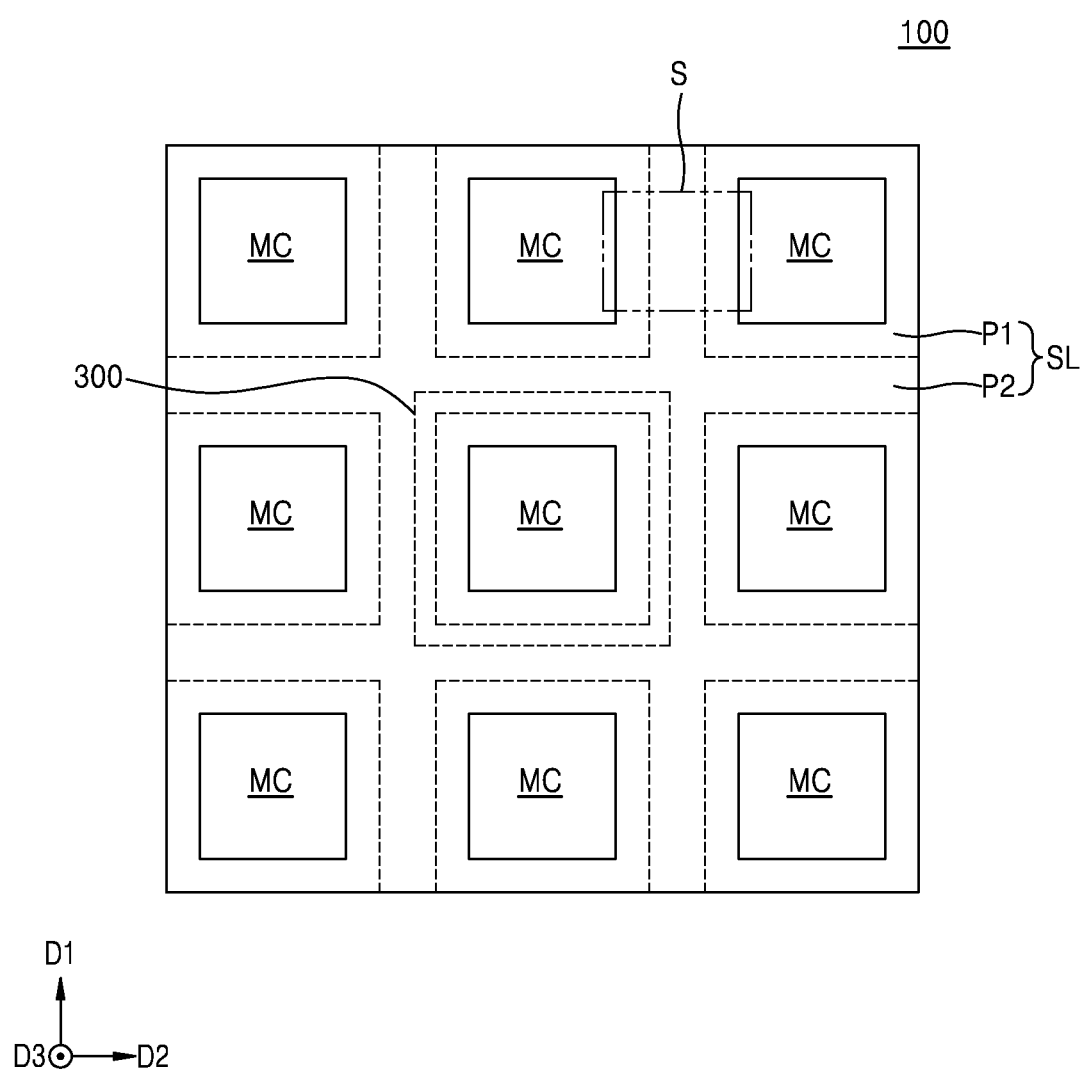

The inventive concept will now be described more fully with reference to the accompanying drawings, in which exemplary embodiments of the inventive concept are shown. The inventive concept may, however, be embodied in many different forms and should not be construed as being limited to the exemplary embodiments set forth herein; rather, these embodiments are provided so that this disclosure will be thorough and complete, and will fully convey the concept of the inventive concept to those skilled in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Hereinafter, one or a plurality of embodiments combined thereto may be provided. A terminology "substrate" used herein may denote a substrate itself, or a stack structure including a substrate and predetermined layers or films formed on a surface of the substrate.

A semiconductor device and a semiconductor chip described hereinafter may have various structures, and necessary components are only provided as examples herein and one or more embodiments are not limited thereto. As used herein, the term "and/or" includes any and all combinations of one or more of the associated listed items. Expressions such as "at least one of," when preceding a list of elements, modify the entire list of elements and do not modify the individual elements of the list.

Figure 1B:
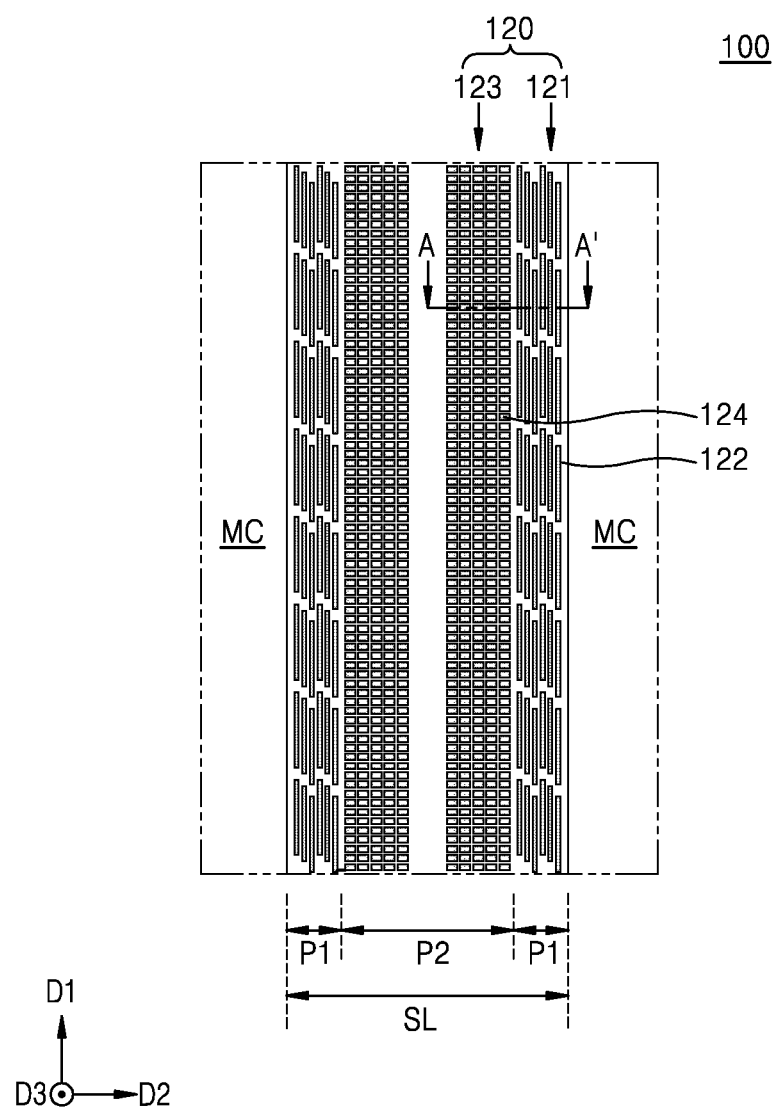
Figure 1C:
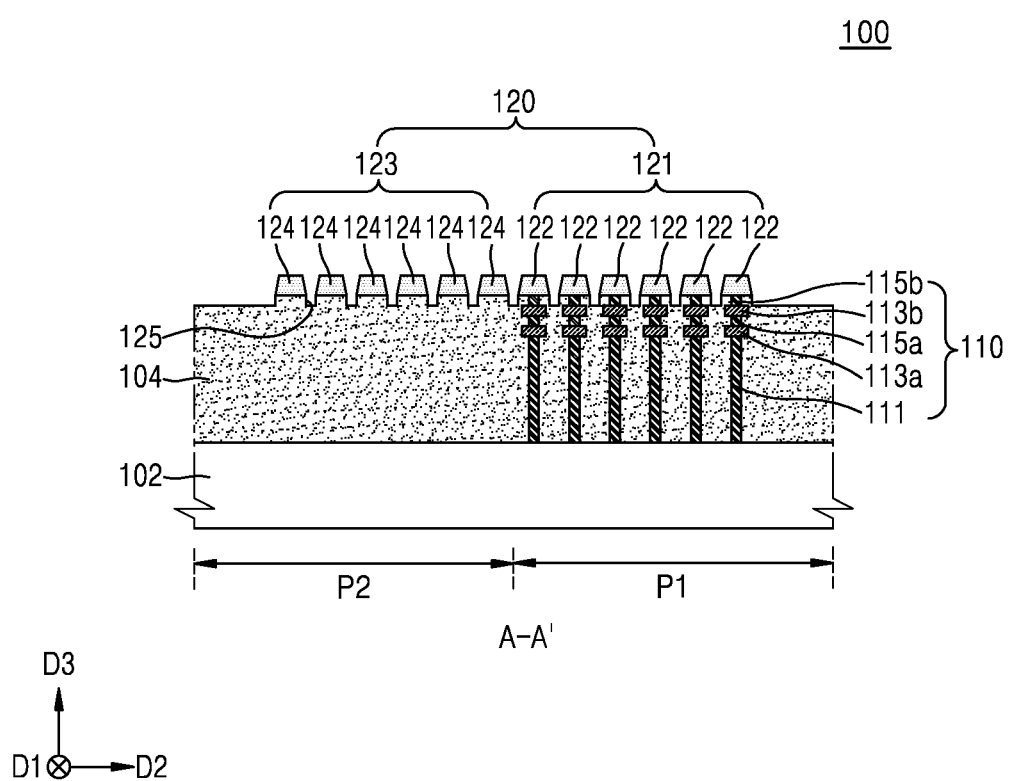

FIG. 1A to 1C are diagrams of a semiconductor device 100 according to an exemplary embodiment, wherein FIG. 1A is a schematic plan view of the semiconductor device 100 according to the exemplary embodiment, FIG. 1B is a schematic plan view showing an enlarged view of a part denoted by "S" in FIG. 1A, and FIG. 1C is a schematic cross-sectional view of the semiconductor device 100 taken along a line A-A' of FIG. 1B.

Referring to FIGS. 1A to 1C, the semiconductor device 100 includes a semiconductor substrate 102 including main chip areas MC and scribe lane areas SL, an insulating layer 104 on the semiconductor substrate 102, an embossing pattern 120 disposed on the insulating layer 104 within the scribe lane areas SL, and dam structures 110 disposed in the insulating layer 104 within the scribe lane areas SL. Here, the semiconductor device 100 may be a semiconductor wafer including a plurality of integrated circuit devices.

The semiconductor substrate 102 may include a semiconductor material, e.g., silicon (Si). Alternatively, the semiconductor substrate 102 may include a semiconductor element such as germanium (Ge), or a semiconductor compound material such as silicon carbide (SiC), gallium arsenide (GaAs), indium arsenide (InAs), and indium phosphide (InP). As another example, the semiconductor substrate 102 may have a semiconductor on insulator (SOI) structure. The semiconductor substrate 102 may include a conductive area, e.g., a well doped with impurities or a structure doped with impurities.

The insulating layer 104 is disposed on a surface of the semiconductor substrate 102. The insulating layer 104 may be formed by stacking a plurality of interlayer insulating layers. The insulating layer 104 may include silicon oxide, silicon nitride, or silicon oxynitride, but is not limited thereto.

As shown in FIG. 1A, the semiconductor device 100 may include the main chip areas MC and the scribe lane areas SL.

The semiconductor device 100 may include a plurality of main chip areas MC, and neighboring main chip areas MC may be spaced apart from each other by a scribe lane area SL interposed therebetween. A semiconductor device may be formed on each of the main chip areas MC. The semiconductor device may include a memory device or a logic device. In addition, the semiconductor device may include a plurality of independent devices of various kinds. The plurality of independent devices may include various fine electronic devices, e.g., a metal-oxide semiconductor field-effect-transistor (MOSFET) such as a complementary metal oxide semiconductor (CMOS) transistor, a system large scale integration (LSI), an image sensor such as a CMOS imaging sensor (CIS), a microelectromechanical system (MEMS), an active device, and a passive device.

Each of the scribe lane areas SL may be disposed between adjacent main chip areas MC, and may surround each main chip area MC. The scribe lane area SL may be cut by a saw blade (BL of FIG. 2A) while a die-sawing process is performed.

The scribe lane area SL may include a first region P1 surrounding and adjacent to edges of the main chip area MC, and a second region P2 surrounding and adjacent to the first region P1. That is, the second region P2 may be spaced apart from the main chip area MC by the first region P1 interposed therebetween. Here, the first region P1 may be a portion where the saw blade BL does not pass through during the die-sawing process, and the second region P2 may include a portion where the saw blade BL passes through to cut during the die-sawing process. That is, the saw blade BL may cut the semiconductor device 100 along with the second region P2.

As the semiconductor substrate 102 and various material layers formed on the semiconductor substrate 102 are cut due to the die-sawing process, the semiconductor device 100 may be divided into a plurality of semiconductor chips 300.

In addition, according to one or more exemplary embodiments, each of the semiconductor chips 300 may include the main chip area MC and a remaining scribe lane area (RSL of FIG. 15) around the main chip area MC. Here, the remaining scribe lane area may denote the scribe lane area SL remaining around the main chip area MC after the die-sawing process is performed with respect to the semiconductor device 100. For example, the remaining scribe lane area may include the first region P1 and a part of the second region P2 adjacent to the first region P1.

As shown in FIG. 1C, the embossing pattern 120 may be disposed on the insulating layer 104 within the scribe lane area SL. The embossing pattern 120 may include first and second embossing structures 122 and 124 protruding from an upper surface of the insulating layer 104. The embossing pattern 120 may include, for example, aluminium or an aluminium alloy, but are not limited thereto.

Trenches 125 may be formed on exposed parts of the insulating layer 104 between adjacent first and second embossing structures 122 and 124 of the embossing pattern 120. In some exemplary embodiments, the trench 125 may be formed by removing a part of the insulating layer 104, by using the embossing pattern 120 as an etching mask. The trench 125 may have a depth extending from bottom surfaces of the embossing structures 122 and 124 toward a lower surface of the insulating layer 120. In some exemplary embodiments, the embossing pattern 120 may include a first embossing pattern 121 including the first embossing structures 122 arranged within the first region P1 and a second embossing pattern 123 including the second embossing structures 124 arranged within the second region P2.

The dam structures 110 may be disposed in the insulating layer 104 within the scribe lane areas SL. The dam structures 110 may extend from a lower surface of the insulating layer 104 in a thickness direction of the insulating layer 104 (for example, a third direction D3). In addition, the dam structures 110 may discontinuously surround the edges of the main chip area MC. The dam structures 110 may be arranged with at least the embossing pattern 120 in the thickness direction of the insulating layer 104 (e.g., the third direction D3). For example, the dam structures 110 may include a conductive material.

Figure 2A:
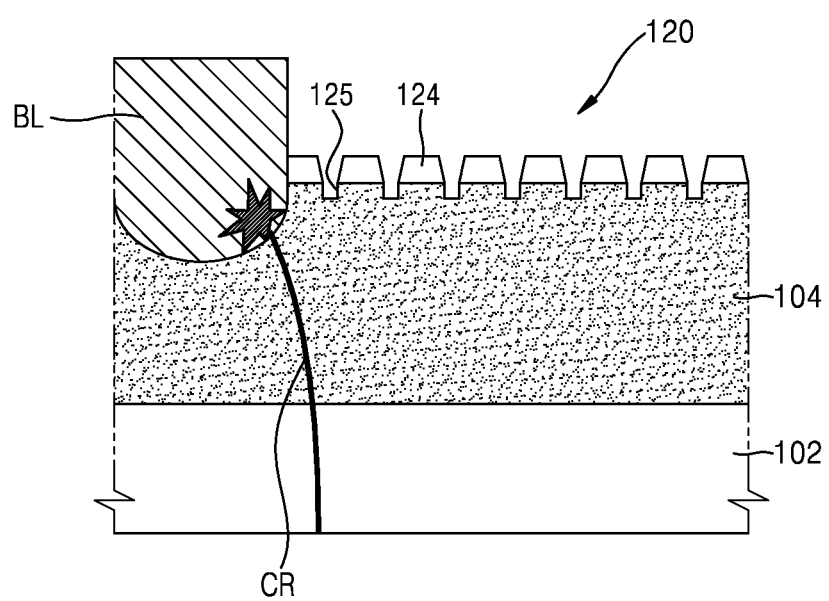
FIGS. 2A and 2B are schematic diagrams showing an aspect of propagating crack generating in a scribe lane region during a die-sawing process.
Figure 2B:
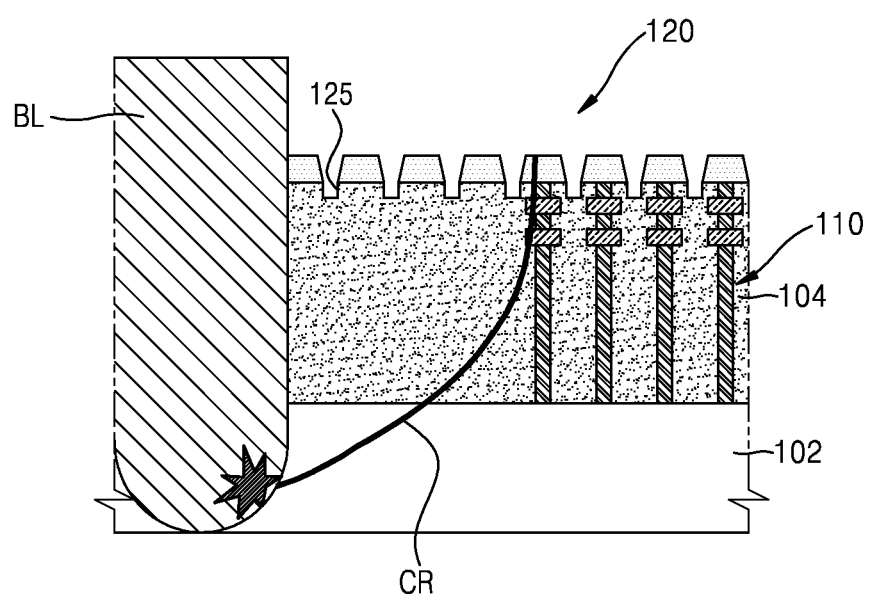

FIGS. 2A and 2B are schematic diagrams of an aspect of propagating cracks CR generating in the scribe lane area SL during the die-sawing process.

Referring to FIGS. 1A, 2A, and 2B, the saw blade BL cuts the insulating layer 104 and the semiconductor substrate 102 in direction from the upper surface of the insulating layer 104 toward the lower surface of the insulating layer 104. While the saw blade BL cuts the semiconductor device 100 along with the scribe lane areas SL, stress is generated due to physical friction between the saw blade BL and the insulating layer 104. Such a stress causes crack CR that propagates within the semiconductor device 100, and when the crack CR propagates toward the main chip area MC, reliability of the integrated circuits may degrade.

As shown in FIG. 2A, the saw blade BL cuts the semiconductor device 100 while proceeding from the upper portion of the insulating layer 104 downward, and then, the saw blade BL contacts the embossing pattern 120. Here, the crack CR starting from a periphery of the embossing pattern 120 moves along with an interface between the embossing pattern 120 and the insulating layer 104. Then, the crack CR contacts the trench 125, and the stress may be dispersed and the crack CR may be extinguished. Otherwise, the crack CR may propagates in a depth direction of the trench 125, that is, the crack CR may not propagate toward the main chip area MC, but propagates toward a lower portion of the semiconductor substrate 102.

As shown in FIG. 2B, the crack CR starting from a portion where the saw blade BL and the insulating layer 104 or the semiconductor substrate 102 contact each other and propagating toward the main chip area MC may meet the dam structure 110. The dam structure 110 may prevent the crack CR from propagating toward the main chip area MC.

Referring back to FIG. 1C, the dam structures 110 may extend from the lower surface of the insulating layer 104 to the upper surface of the insulating layer 104. The dam structures 110 may be aligned in a thickness direction of the insulating layer 104 (e.g., the third direction D3), and exposed out of the upper portion of the insulating layer 104 to connect partially to the embossing pattern 120.

As an exemplary embodiment, the dam structures 110 may each include a first dummy wiring layer 113a and a second dummy wiring layer 113b arranged at different height levels in the insulating layer 104 in order to form a multi-layered dummy wiring layer, a first dummy via 115a connecting the dummy wiring layers to each other, a second dummy via 115b connecting the second dummy wiring layer 113b, that is, an uppermost layer between the multi dummy wiring layers, to the first embossing structure 122, and a dummy via contact 111 extending from the lower surface of the insulating layer 104 and connected to the first dummy wiring layer 113a that is a lowermost layer among the multi wiring dummy layers.

Also, the dam structure 110 may include a support pattern connected to a lower portion of the dummy via contact 111 to support the dummy via contact 111. In some exemplary embodiments, the support pattern may be embedded in the semiconductor substrate 102, but is not limited thereto. That is, the support pattern may protrude from a surface of the semiconductor substrate 102. The support pattern may include, for example, polysilicon, but is not limited thereto.

In addition, FIG. 1C exemplarily shows that the dam structure 110 includes the dual dummy wiring layers 113a and 113b, but one or more embodiments are not limited thereto. That is, the dam structure 110 may include more than two layers, e.g., four or eight dummy wiring layers. Alternatively, the dam structure 110 may include a single dummy wiring layer.

Figure 3:
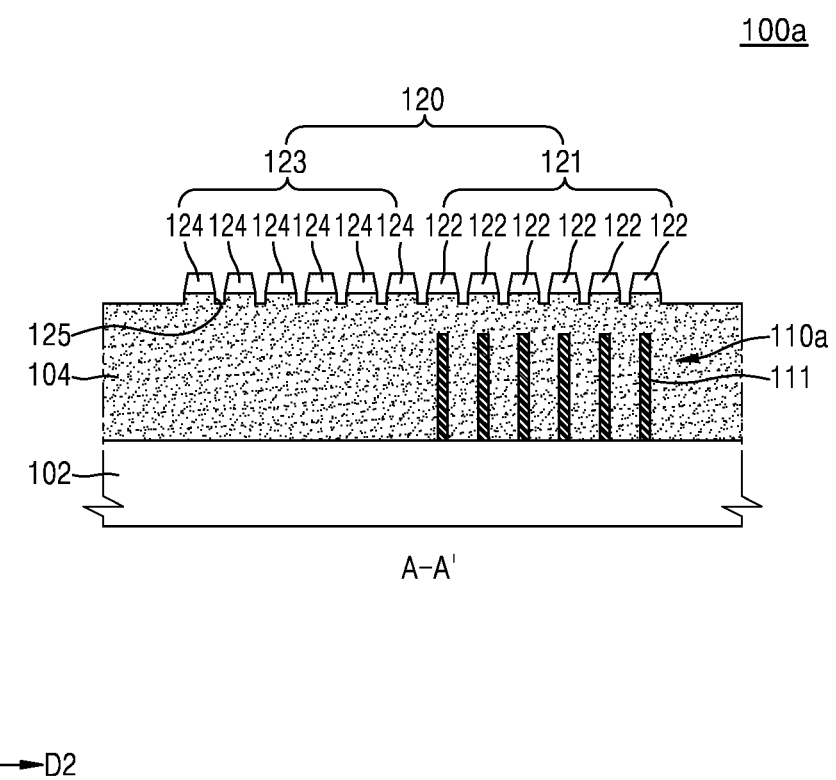
FIG. 3 is a schematic cross-sectional view of the semiconductor device taken along a line A-A' of FIG. 1B for illustrating a dam structure.
Figure 4:
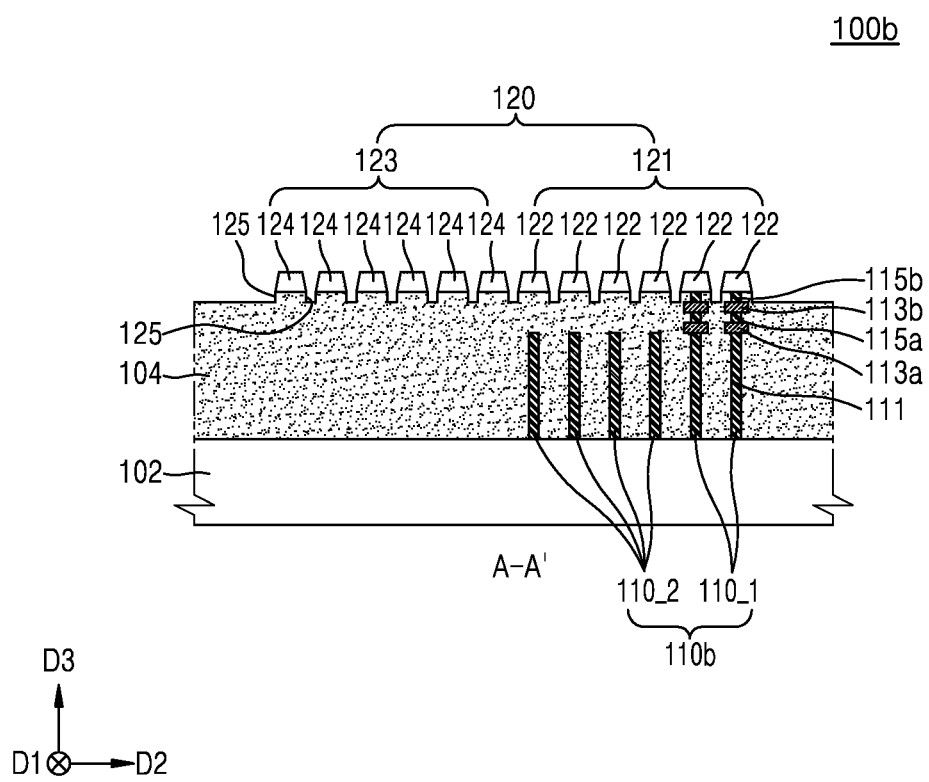
FIG. 4 is a schematic cross-sectional view of the semiconductor device taken along a line A-A' of FIG. 1B for illustrating a dam structure.

FIGS. 3 and 4 are schematic cross-sectional views of a semiconductor device 100 taken along a line A-A' of FIG. 1B, for illustrating dam structures 110a according to an exemplary embodiment.

Referring to FIG. 3, the dam structures 110a extend from the lower surface of the insulating layer 104, and may be spaced apart from the upper surface of the insulating layer 104 by a predetermined distance. Accordingly, the dam structures 110a may be separate from the embossing pattern 120.

For example, each of the dam structures 110a may include only the dummy via contact 111 extending from the lower surface of the insulating layer 104 to a predetermined height, as shown in FIG. 3. However, the dam structures 110a are not limited to the above example. That is, unlike the example shown in FIG. 3, the dam structures 110a may each further include at least one of the first dummy wiring layer 113a, the first dummy via 115a, and the second dummy wiring layer 113b illustrated in FIG. 1C.

Referring to FIG. 4, dam structures 110b may include first dam structures 110_1 extending from the lower surface to the upper surface of the insulating layer 104, and second dam structures 110_2 extending from the insulating layer 104 and spaced apart a predetermined distance from the upper surface of the insulating layer 104. The first dam structures 110_1 are connected at least partially to the embossing pattern 120, but the second dam structures 110_2 may be spaced apart from the embossing pattern 120.

In some exemplary embodiments, the first dam structures 110_1 may be closer to the main chip area MC than the second dam structures 110_2.

Referring back to FIGS. 1A to 1C, the embossing pattern 120 may include the first embossing pattern 121 having the plurality of first embossing structures 122 and the second embossing pattern 123 having the plurality of second embossing structures 124.

The first embossing pattern 121 may be arranged within the first region P1 of the scribe lane area SL, and may be adjacent to and at least partially surround the edge of the main chip area MC. Also, the second embossing pattern 123 may be arranged within the second region P2 of the scribe lane area SL, and may be adjacent to surround the first embossing pattern 121. That is, the second embossing pattern 123 may be spaced apart from the main chip area MC by the first embossing pattern 121 interposed therebetween.

In some exemplary embodiments, the first embossing structures 122 configuring the first embossing pattern 121 and the second embossing structures 124 configuring the second embossing pattern 123 may have different shapes from each other. For example, a length in which the first embossing structure 122 extends along the edge of the main chip area MC (for example, an extending length of the first embossing structure 122 in the first direction D1) may be longer than a length in which the second embossing structure 124 extends along the edge of the main chip area MC (for example, an extending length of the second embossing structure 124 in the first direction D1).

The first embossing structure 122 configuring the first embossing pattern 121 may be formed as a line extending along the edge of the main chip area MC, or a bar having a longer axis in the edge direction of the main chip area MC.

The second embossing structure 124 configuring the second embossing pattern 123 may be formed as a dot or rectangle.

In addition, in some exemplary embodiments, the first embossing structure 122 and/or the second embossing structure 124 may have an inclined side surface. That is, the first embossing structure 122 and/or the second embossing structure 124 may have a shape that becomes narrower in a height direction.

In addition, the plurality of first embossing structures 122 each having the line shape or the bar shape extending along the edge of the main chip area MC may be arranged along the edge of the main chip area MC to be spaced apart from one another, and may discontinuously surround the main chip area MC. Also, the plurality of first embossing structures 122 are arranged in a direction away from the edge of the main chip area MC, and thereby surrounding the main chip area MC in layers.

The plurality of second embossing structures 124 each having the dot shape are arranged along the edge of the main chip area MC, and at the same time, arranged in a direction away from the main chip area MC. For example, the plurality of second embossing structures 124 may be arranged as a matrix.

Figure 5:
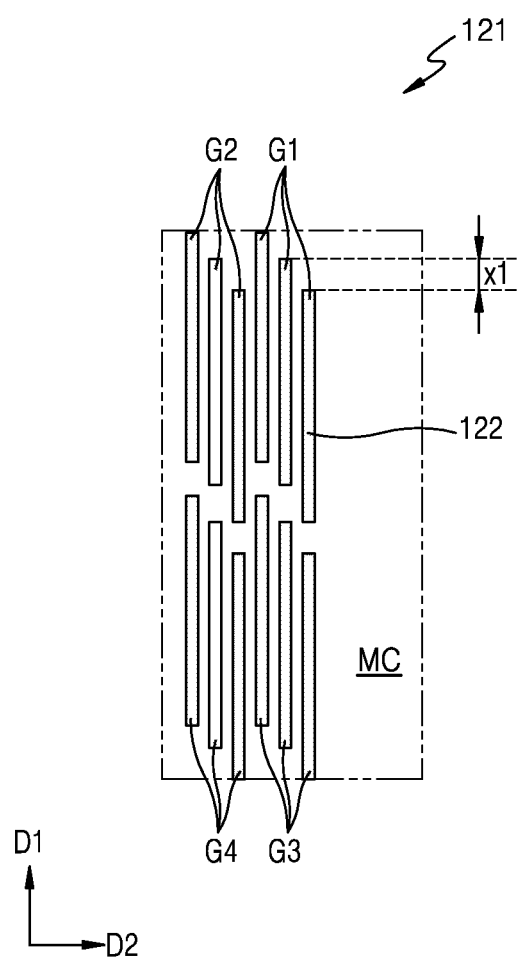
FIG. 5 is a plan view of a first embossing pattern in a semiconductor device according to an exemplary embodiment.

FIG. 5 is a plan view of the first embossing pattern 121 of the semiconductor device according to an exemplary embodiment.

Referring to FIG. 5 and FIG. 1A, the plurality of first embossing structures 122 are arranged along the edge of the main chip area MC (e.g., the first direction D1), and may be arranged in a direction perpendicular to the edge of the main chip area MC (e.g., the second direction D2). The first embossing structures 122 adjacent to each other in the first direction D1 are spaced apart a predetermined distance from each other in the first direction D1, and the first embossing structures 122 adjacent to each other in the second direction D2 may be spaced apart a predetermined distance from each other. The first embossing structures 122 surround the main chip area MC in layers, and may discontinuously surround the edge of the main chip area MC.

In addition, the first embossing structures 122 that are adjacent to each other in a direction perpendicular to the edge of the main chip area MC (e.g., the second direction D2) may be arranged to be offset in the direction along the edge of the main chip area MC (e.g., the first direction D1) as much as a first distance x1. Then, the first embossing structures 122 may be arranged in the second direction D2 in the form of stairs.

When three first embossing structures 122 that are offset a predetermined distance in the first direction D1 and arranged in the second direction D2 form a group, the first embossing structures 122 may be arranged in the first direction D1 and the second direction D2 while forming a plurality of groups. For example, first embossing structures of a first group G1 and first embossing structures of a second group G2 may be arranged in the second direction D2, and the first embossing structures of a third group G3 and the first embossing structures of a fourth group G4 may be arranged in the second direction D2. Also, the first embossing structures of the first group G1 and the first embossing structures of the third group G3 may be arranged in the first direction D1, and the first embossing structures of the second group G2 and the first embossing structures of the fourth group G4 may be arranged in the first direction D1.

Here, three first embossing structures 122 are offset in the first direction to form one group, but the number of the first embossing structures 122 forming one group is not limited thereto.

Figure 6:
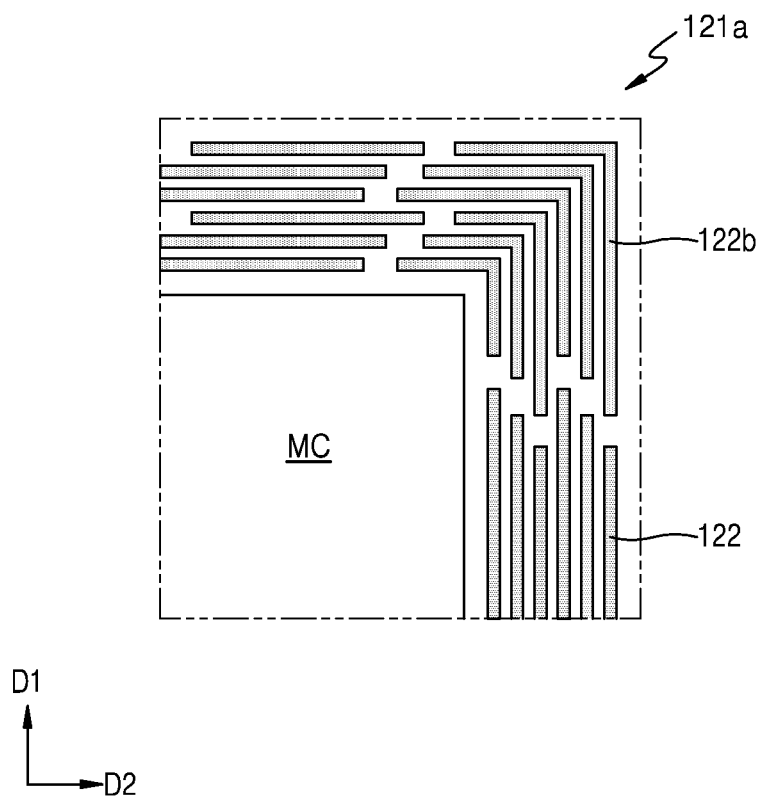
FIG. 6 is a plan view of a first embossing pattern in a semiconductor device according to an exemplary embodiment.

FIG. 6 is a plan view of a first embossing pattern 121a of a semiconductor device according to an exemplary embodiment.

Referring to FIG. 6 and FIG. 1A, the first embossing pattern 121a may include first embossing structures 122b that are bent around a corner of the main chip area MC, i.e., at a portion adjacent to a corner of the main chip area MC.

The first embossing structures 122b having bent shape may not be provided at every corner of the main chip area MC, but may be provided at some of the corners of the main chip area MC.

Figure 7:
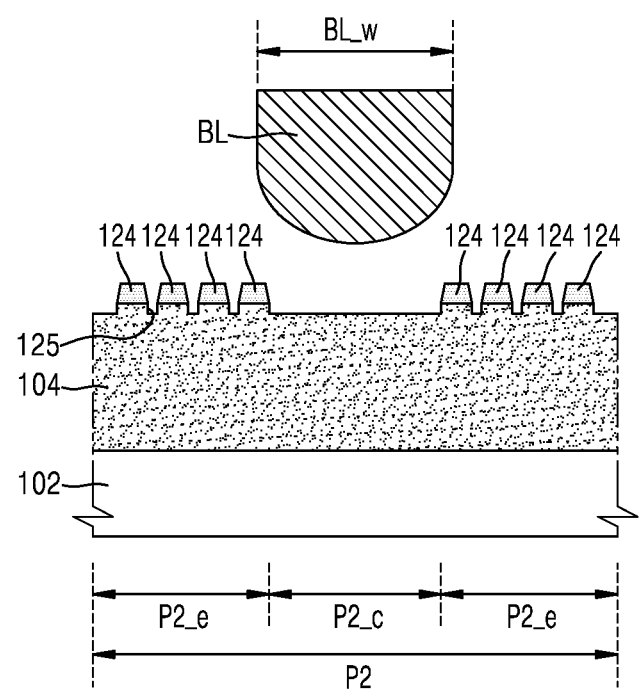
FIG. 7 is a cross-sectional view of a second region in a semiconductor device according to an exemplary embodiment.

FIG. 7 is a cross-sectional view of the second region P2 in the semiconductor device according to an exemplary embodiment.

Referring to FIG. 7, the second embossing structures 124 may be arranged at edge portions P2_e of the second region P2, except a center portion P2_c of the second region P2. Here, the edge portions P2_e of the second region P2 may denote regions adjacent to boundaries between the first region P1 and the second region P2. That is, opposite sides of the center portion P2_c in the second region P2 may contact the edge portions P2_e of the second region P2.

A blade region may denote a region that is directly cut by the saw blade BL during performing the die-sawing process. In some exemplary embodiments, the blade region may include the center portion P2_c of the second region P2 and some parts of the edge portions P2_e, which are adjacent to the center portion P2_c of the second region P2. In other words, a width BL_w of the blade region may be greater than a width of the center portion P2_c of the second region P2.

Accordingly, while the die-sawing process is performed, the saw blade BL cuts the semiconductor device 100 along the center portion P2_c of the second region P2. Here, opposite sides of the saw blade BL contact the second embossing structures 124, and a center portion of the saw blade BL may directly cut the insulating layer 104 without contacting the second embossing structures 124.

Since the second embossing structures 124 are not arranged at the center portion P2_c of the second region P2, wherein the saw blade BL mainly contacts the center portion P2_c, generation of particles that are generated when the second embossing structures 124 are damaged may be reduced.

Figure 8:
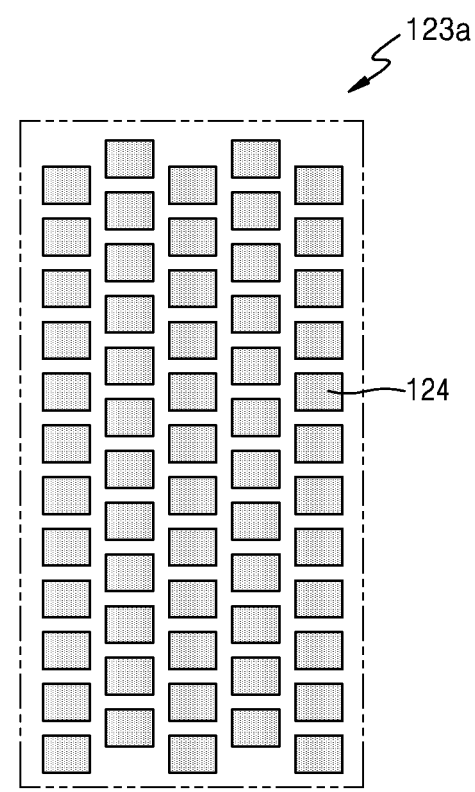
FIG. 8 is a plan view of a second embossing pattern in a semiconductor device according to an exemplary embodiment.
Figure 8:
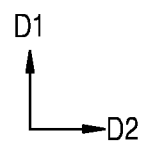

FIG. 8 is a plan view of a second embossing pattern 123a of a semiconductor device according to an exemplary embodiment.

Referring to FIG. 8, the second embossing structures 124 forming the second embossing pattern 123a may be formed as dots. Here, adjacent ones of the second embossing structures 124 may be arranged to be offset from one another in the second direction, i.e., in zig-zag pattern, unlike in FIG. 1B. That is, the second embossing structures 124 may be arranged in a zig-zag pattern in the first direction D1. Alternatively, the second embossing structures 124 may be arranged in zig-zag pattern along the second direction D2.

Figure 9:
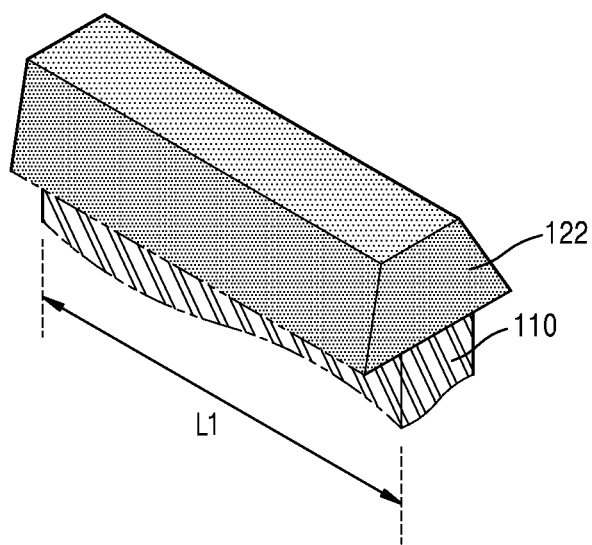
FIG. 9 is a schematic perspective view of a part of a dam structure and a first embossing structure in a semiconductor device according to an exemplary embodiment.

FIG. 9 is a schematic perspective view of a part of the dam structure 110 and the first embossing structure 122 of the semiconductor device according to an exemplary embodiment.

Referring to FIGS. 1A to 1C, and 9, the dam structures 110 are arranged on the first region P1, and the dam structures 110 and the first embossing structures 122 may be arranged in a thickness direction of the insulating layer 104.

In some exemplary embodiments, the first embossing structures 122 may each have a line shape or a bar shape extending along the edge of the main chip area MC, and the dam structures 110 disposed under the first embossing structures 122 may also have line shapes or bar shapes extending along the edge of the main chip area MC.

Here, the dam structure 110 may extend to a first length L1 along the edge of the main chip area MC, and the first length L1 may correspond to an extending length of the first embossing structure 122 along the edge of the main chip area MC.

Figure 10:
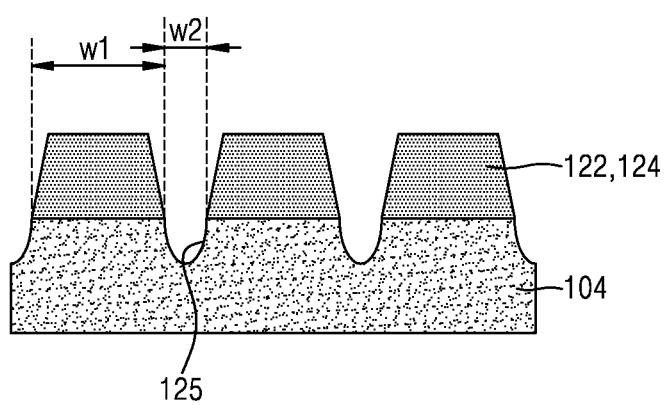
FIG. 10 is a cross-sectional view of an embossing pattern and a trench formed on an insulating layer in a semiconductor device according to an exemplary embodiment.
Figure 10:
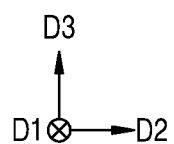

FIG. 10 is a cross-sectional view of the embossing patterns and trenches 125 formed in an upper portion of the insulating layer 104 in the semiconductor device according to an exemplary embodiment.

Referring to FIGS. 1C and 10, the first embossing structures 122 or the second embossing structures 124 are arranged on the insulating layer 104, and the trench 125 may be formed between two adjacent first embossing structures 122 or two adjacent second embossing structures 124.

In some exemplary embodiments, the trench 125 may be formed from the upper surface of the insulating layer 104 to a predetermined depth downward, and the trench 125 may have a shape that becomes narrower downwardly and a rounded end. The trench 125 having the rounded shape may evenly disperse a crack, and the crack may be removed effectively.

In addition, the first embossing structures 122 or the second embossing structures 124 may each have a first width w1 in a direction perpendicular to the edge of the main chip area MC (e.g., the second direction D2), and the two adjacent first embossing structures 122 or the two adjacent second embossing structures 124 may be spaced a second width w2 apart from each other.

Here, the first width w1 may denote a width at a bottom surface of the first embossing structure 122 or the second embossing structure 124. The second width w2 may denote a distance between the two adjacent first or second embossing structures 122 or 124 at the same level as that of the bottom surface of the first embossing structure 122 or the second embossing structure 124. In some exemplary embodiments, the first width w1 may be greater than the second width w2. For example, the first width w1 may be twice as large as the second width w2, but is not limited thereto.

In addition, referring back to FIGS. 1A to 1C, the trench 125 that is formed by partially removing the insulating layer 104 exposed through the embossing pattern 120 may be continuously formed throughout.

Otherwise, in some other exemplary embodiments, the trench 125 may be formed in a certain region of the insulating layer 104.

Figure 11A:
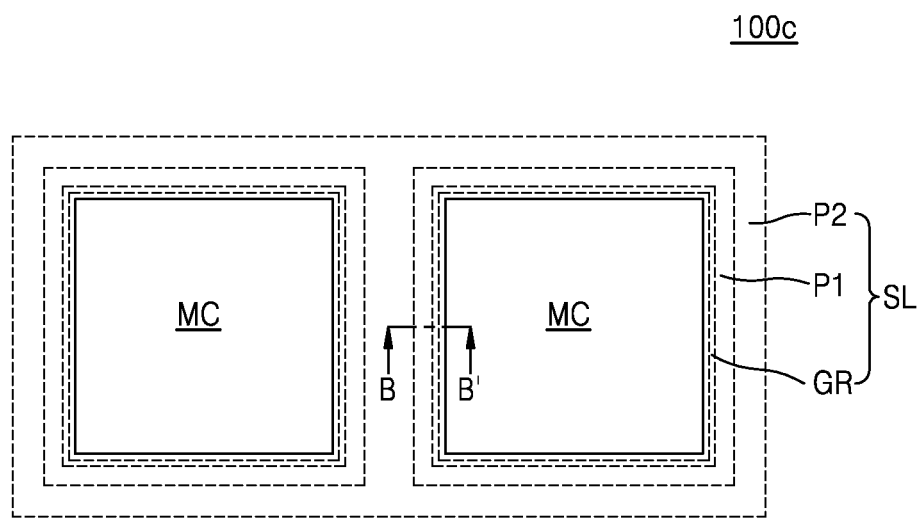
FIG. 11A is a schematic plan of a semiconductor device according to an exemplary embodiment.
Figure 11B:
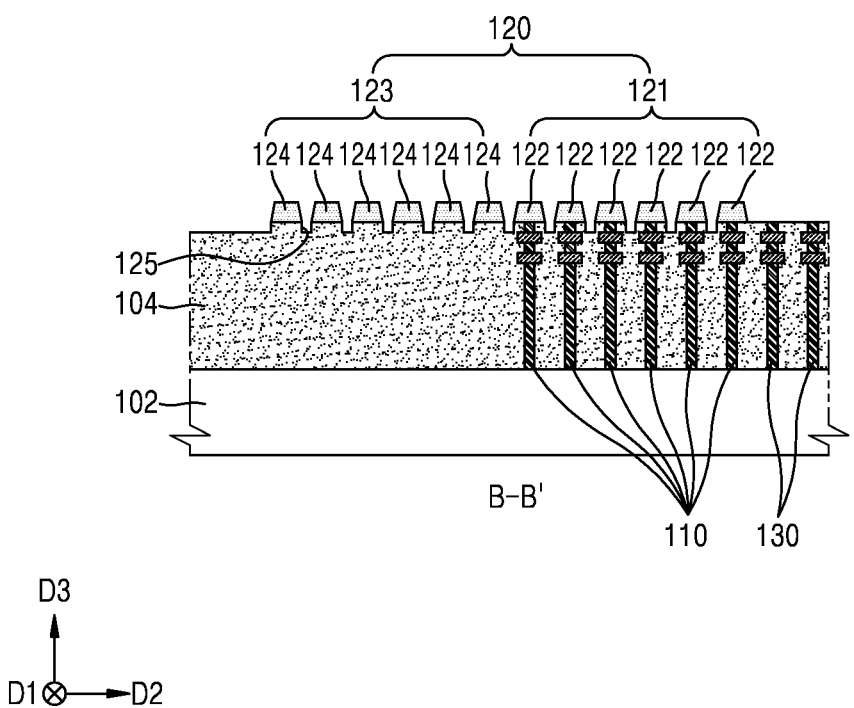
FIG. 11B is a schematic cross-sectional view of the semiconductor device taken along a line B-B' of FIG. 11A.

FIGS. 11A and 11B are diagrams illustrating a semiconductor device 100c according to an exemplary embodiment, wherein FIG. 11A is a schematic plan view of the semiconductor device 100c according to the exemplary embodiment, and FIG. 11B is a schematic cross-sectional view of the semiconductor device 100c taken along a line B-B' of FIG. 11A.

The semiconductor device 100c shown in FIGS. 11A and 11B is substantially the same as the semiconductor device 100 illustrated with reference to FIGS. 1A to 1C, except that the semiconductor device 100c further includes a guard ring structure forming region GR and guard ring structures 130 arranged in the guard ring structure forming region GR. In FIGS. 11A and 11B, like reference numerals as those of FIGS. 1A to 1C denote the same elements, and detailed descriptions thereof are omitted.

Referring to FIGS. 11A and 11B, the scribe lane area SL may include the first region P1 and the second region P2, and the first region P1 may include the guard ring structure forming region GR on which the guard ring structures 130 are arranged. The guard ring structure forming region GR may surround edges of the main chip area MC.

The guard ring structures 130 may be arranged between the dam structures 110 and the main chip area MC. The guard ring structures 130 may continuously surround the edges of the main chip area MC as a ring type or a loop type.

In FIG. 11B, the guard ring structures 130 surround the edges of the main chip area MC in dual layers, but the number of guard ring structures 130 is not limited thereto.

The guide ring structures 130 may be arranged in the insulating layer 104. The guard ring structures 130 may extend from the lower surface of the insulating layer 104 in the thickness direction of the insulating layer 104.

In some exemplary embodiments, the embossing pattern 120 may not be disposed on the guard ring structure forming region GR, in which the guard ring structures 130 are formed.

Alternatively, in some other exemplary embodiments, the first embossing pattern 121 may be formed on the guard ring structure forming region GR, and the first embossing structures 122 may be arranged with the guard ring structures 130 in the thickness direction of the insulating layer 104. Here, the first embossing structures 122 arranged on the guard ring structure forming region GR may be continuously formed along the edges of the main chip area MC like the guard ring structures 130, or may be discontinuously formed unlike the guard ring structures 130.

In addition, in some exemplary embodiments, the guard ring structures 130 may extend from the lower surface of the insulating layer 104 to the upper surface of the insulating layer 104. The guard ring structures 130 may be substantially the same as the dam structures 110 shown in FIG. 1C. That is, the guard ring structures 130 may each include a dummy via contact, dummy wiring layers, and a dummy via. However, configurations of the guard ring structures 130 are not limited thereto, and the guard ring structures 130 may be differently configured from the dam structures 110 illustrated with reference to FIG. 1C.

In some other exemplary embodiments, the guard ring structures 130 may extend from the lower surface of the insulating layer 104, and may be spaced apart by a predetermined distance from the upper surface of the insulating layer 104. The guard ring structures 130 may include only the dummy via contact, like the dam structures 110 illustrated with reference to FIG. 3. However, configurations of the guard ring structures 130 are not limited to the above example.

Figure 12A:
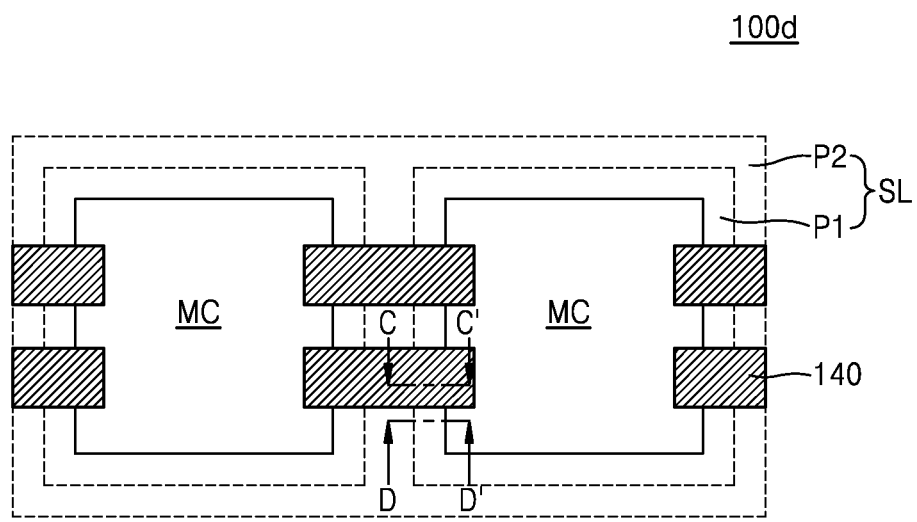
FIG. 12A is a schematic plan view of a semiconductor device according to an exemplary embodiment.
Figure 12B:
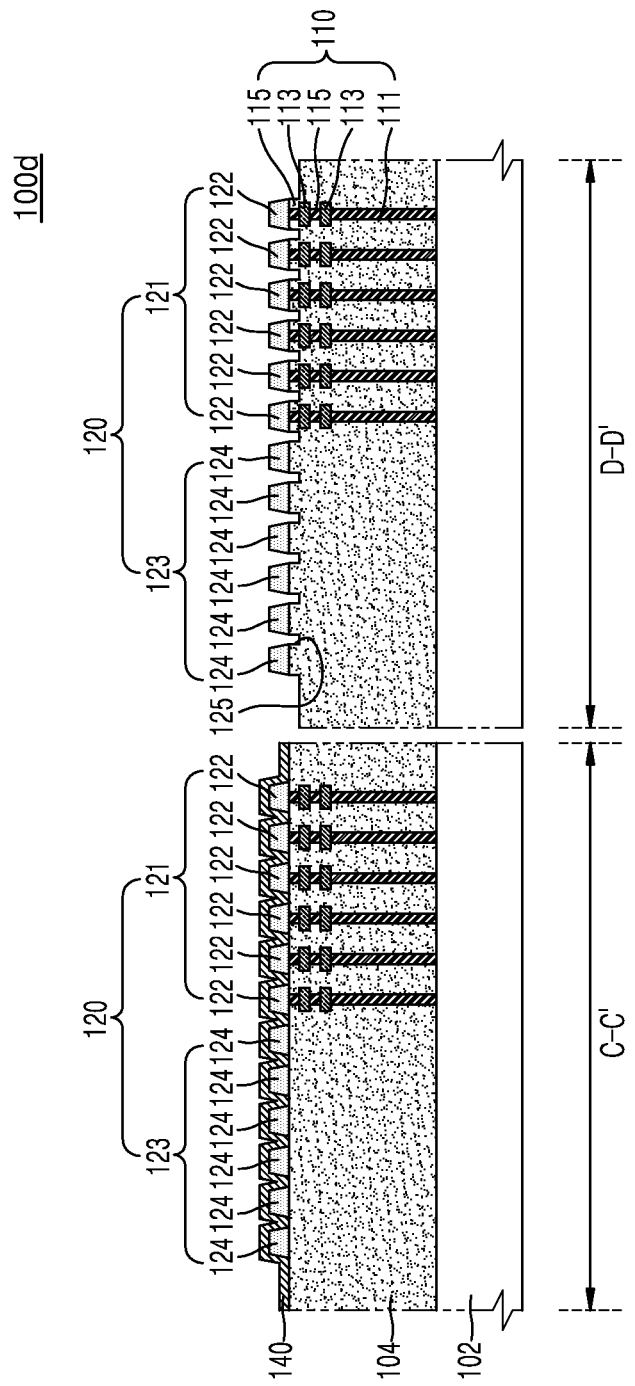
FIG. 12B is a schematic cross-sectional view of the semiconductor device taken along a line C-C' and a line D-D' of FIG. 12A.

FIG. 12A is a plan view of a semiconductor device 100d according to an exemplary embodiment, and FIG. 12B is a schematic cross-sectional view of the semiconductor device 100c taken along a line C-C' and a line D-D' of FIG. 12A.

The semiconductor device 100d illustrated with reference to FIGS. 12A and 12B is substantially the same as the semiconductor device 100 illustrated with reference to FIGS. 1A to 1C, except that the semiconductor device 100d further includes a passivation layer 140. In FIGS. 12A and 12B, like reference numerals as those of FIGS. 1A to 1C denote the same elements, and detailed descriptions thereof are omitted.

Referring to FIGS. 12A and 12B, the semiconductor device 100d may further include the passivation layer 140 formed on the insulating layer 104 and covering at least partially the embossing pattern 120. In some exemplary embodiment, the passivation layer 140 may include a material that is different from that of the insulating layer 104. For example, the passivation layer 140 may include a silicon nitride layer.

In some exemplary embodiments, the passivation layer 140 may be only formed partially on the scribe lane area SL. Accordingly, the passivation layer 140 may cover a part of the embossing pattern 120, and expose another part of the embossing pattern 120.

Here, the trench 125 may not be formed in the portion of the insulating layer 104, where the passivation layer 140 is formed. That is, the trench 125 may be formed in the portion of the insulating layer 104, where the passivation layer 140 is not formed.

FIGS. 13A to 13F are cross-sectional views illustrating a method of manufacturing a semiconductor device according to an exemplary embodiment in a processing order. In FIGS. 13A to 13F, the method of manufacturing the semiconductor device 100 illustrated with reference to FIGS. 1A to 1C will be described as an example. FIGS. 13A to 13F show the scribe lane area SL and the main chip area MC in the semiconductor device 100.

Figure 13A:
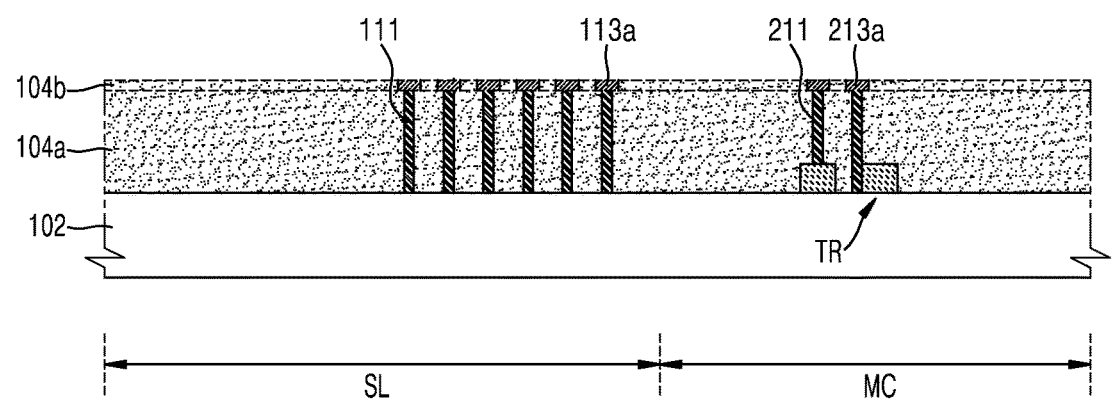
FIGS. 13A to 13F are cross-sectional views of a method of manufacturing a semiconductor device according to an exemplary embodiment in a processing order.

Referring to FIG. 13A, a semiconductor substrate 102 includes the scribe lane areas SL and the main chip areas MC.

In addition, the dummy via contacts 111 are formed on a surface of the semiconductor substrate 102 within the scribe lane area SL, and a first interlayer insulating layer 104a filling in a periphery of the dummy via contacts 111 is formed on the surface of the semiconductor substrate 102. Also, a via contact 211 and at least one transistor TR are formed on the surface of the semiconductor substrate 102 within the main chip area MC, and a first interlayer insulating layer 104a surrounding the via contact 211 and the transistor TR is formed on the surface of the semiconductor substrate 102.

In some exemplary embodiments, the dummy via contacts 111 and the via contact 211 may be formed respectively on support patterns disposed thereunder. The support patterns may be, for example, embedded in the semiconductor substrate 102, but are not limited thereto. That is, the support patterns may protrude from the surface of the semiconductor substrate 102. The support pattern may include, for example, polysilicon, but is not limited thereto.

The first interlayer insulating layer 104a may include silicon oxide, silicon nitride, or silicon oxynitride.

The transistor TR may be obtained by forming a gate electrode structure on the surface of the semiconductor substrate 102 and doping impurities in the semiconductor substrate 102 located at opposite sides of the gate electrode structure.

Also, in some exemplary embodiments, the dummy via contacts 111 arranged on the scribe lane area SL and the via contact 211 arranged on the main chip area MC may include metal, metal silicide, semiconductor doped with impurities, or a combination thereof. For example, the dummy via contacts 111 and the via contact 211 may include metal such as tungsten, nickel, cobalt, and tantalum, metal silicide such as tungsten silicide, nickel silicide, cobalt silicide, and tantalum silicide, polysilicon doped with impurities, or a combination thereof, but are not limited thereto.

In addition, a second interlayer insulating layer 104b is formed on the first interlayer insulating layer 104a throughout the main chip area MC and the scribe lane area SL. The second interlayer insulating layer 104b may include a first dummy wiring layer 113a disposed on the scribe lane area SL, and a first wiring layer 213a disposed on the main chip area MC. The first dummy wiring layer 113a may be connected to the dummy via contacts 111, and the first wiring layer 213a may be connected to the via contact 211.

The second interlayer insulating layer 104b may include silicon oxide, silicon nitride, or silicon oxynitride.

In some exemplary embodiments, in order to form the first dummy wiring layer 113a and the first wiring layer 213a, the second interlayer insulating layer 104b covering the first interlayer insulating layer 104a, the dummy via contacts 111, and the via contact 211 is formed over the substrate 102, and the second interlayer insulating layer 104b is partially removed to form a plurality of openings of line shapes for exposing the dummy via contacts 111 and the via contact 211 through the second interlayer insulating layer 104b. After that, the first dummy wiring layers 113a and the first wiring layer 213a filling the plurality of openings having the line shape may be respectively formed on the scribe lane area SL and the main chip area MC.

Figure 13B:
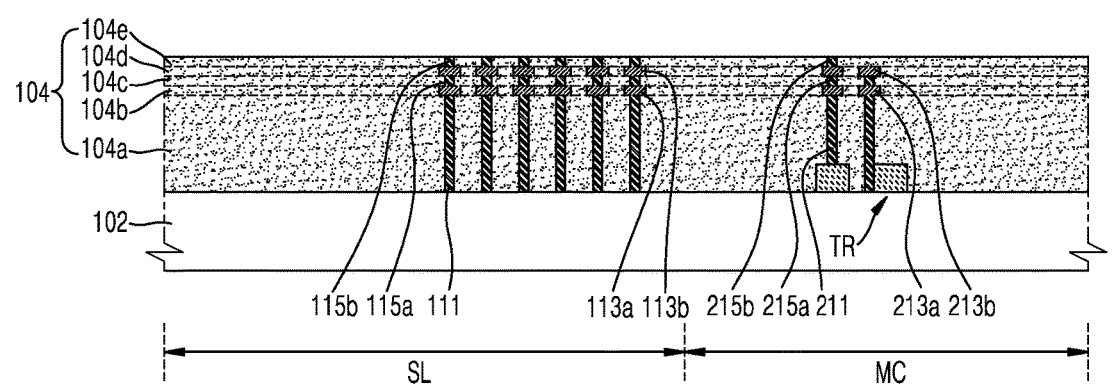

Referring to FIG. 13B, a third interlayer insulating layer 104c, a fourth interlayer insulating layer 104d, and a fifth interlayer insulating layer 104e are sequentially formed on the second interlayer insulating layer 104b. The third interlayer insulating layer 104c may include first dummy vias 115a on the scribe lane area SL, and may include a first via 215a on the main chip area MC. The fourth interlayer insulating layer 104d may include second dummy wiring layers 113b on the scribe lane area SL, and may include a second wiring layer 213b on the main chip area MC. The fifth interlayer insulating layer 104e may include second dummy vias 115b on the scribe lane area SL, may include a second via 215b on the main chip area MC.

In more detail, the third interlayer insulating layer 104c is formed on the second interlayer insulating layer 104b throughout the main chip area MC and the scribe lane area SL. Openings exposing the first dummy wiring layers 113a and the first wiring layer 213a are formed in the third interlayer insulating layer 104c, and then, the openings are filled with a conductive material to form the first dummy vias 115a and the first via 215a.

In addition, the fourth interlayer insulating layer 104d is formed on the third interlayer insulating layer 104c throughout the main chip area MC and the scribe lane area SL. After that, the second dummy wiring layers 113b and the second wiring layer 213b may be formed by a damascene process.

Next, the fifth interlayer insulating layer 104e is formed on the fourth interlayer insulating layer 104d throughout the main chip area MC and the scribe lane area SL. Openings for exposing the second dummy wiring layers 113b and the second wiring layer 213b are formed in the fifth interlayer insulating layer 104e, and then, the openings are filled with a conductive material to form the second dummy vias 115b and the second via 215b.

The third to fifth interlayer insulating layers 104c to 104e may include silicon oxide, silicon nitride, or silicon oxynitride.

In some exemplary embodiments, the dummy via contact 111, the first dummy wiring layer 113a, the first dummy via 115a, the second dummy wiring layer 113b, and the second dummy via 115b forming each of the dam structures 110 may be formed as lines or bars extending along the edge of the main chip area MC.

Figure 13C:
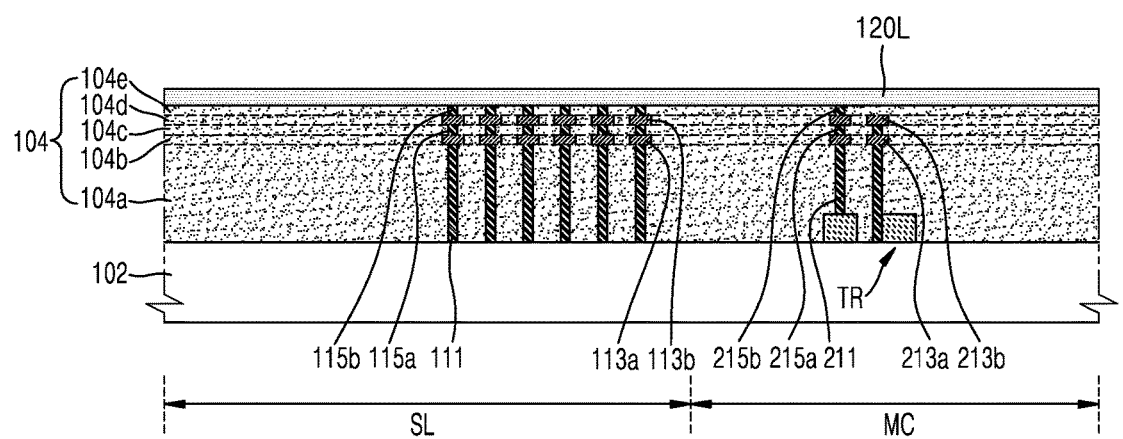

Referring to FIG. 13C, a metal layer 120L is formed on the insulating layer 104. The metal layer 120L may be formed on both of the scribe lane area SL and the main chip area MC. For example, the metal layer 120L may include aluminium or an aluminium alloy, but is not limited thereto.

Figure 13D:
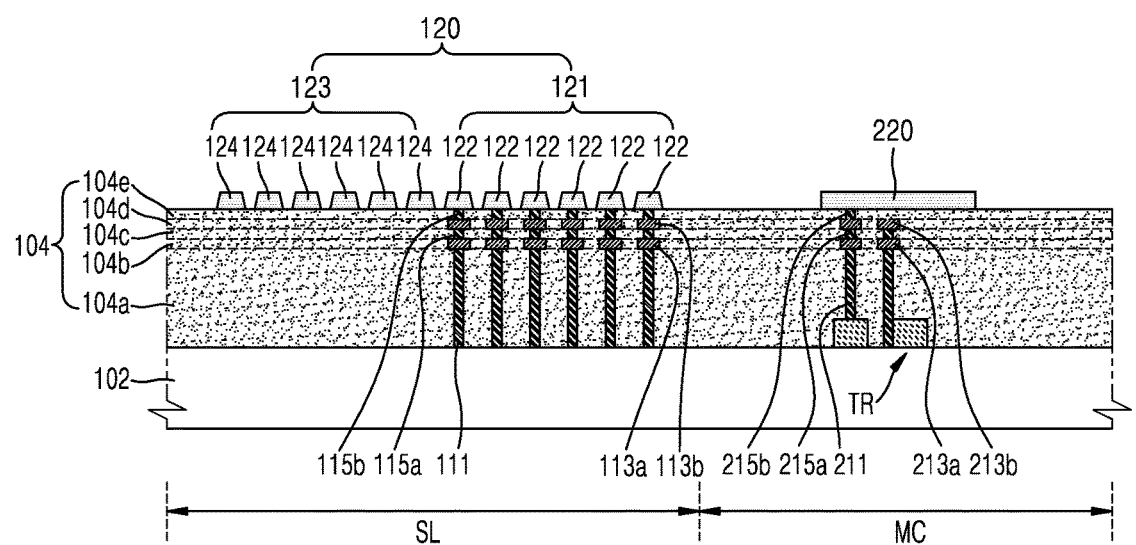

Referring to FIG. 13D, the metal layer 120L is patterned to form the embossing pattern 120 on the scribe lane area SL, and form a landing pad 220 on the main chip area MC.

In some exemplary embodiments, referring to FIGS. 13D and 1B, the embossing pattern 120 may include the first embossing pattern 121 formed on the first region P1 and the second embossing pattern 123 formed on the second region P2. The first embossing structures 122 and the dam structures 110 may overlap with each other in the thickness direction of the insulating layer 104.

In some exemplary embodiments, the first embossing structures 122 forming the first embossing pattern 121 and the second embossing structures 124 forming the second embossing pattern 123 may be patterned to have different shapes from each other. For example, lengths in which the first embossing structures 122 and the second embossing structures 124 extend along the edge of the main chip area MC may be different from each other. Otherwise, the first embossing structures 122 may be formed as lines or bars extending along the edge of the main chip area MC, and the second embossing structures 124 may be formed as dots.

Figure 13E:
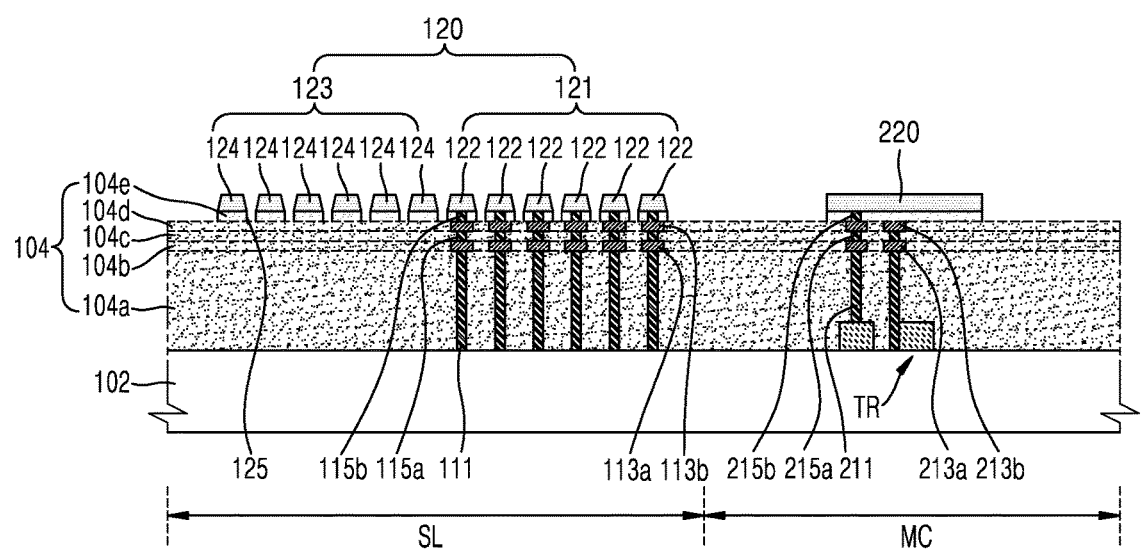

Referring to FIG. 13E, the insulating layer 104 exposed through the embossing pattern 120 is partially removed by using the embossing pattern 120 as an etching mask to form the trenches 125. The trenches 125 may extend from the bottom surface of the embossing pattern 120 to the lower level. In addition, in FIG. 13E, the trench 125 is formed to an upper surface of the fourth interlayer insulating layer 104d, but is not limited thereto, that is, a depth of the trench 125 may vary.

Figure 13F:
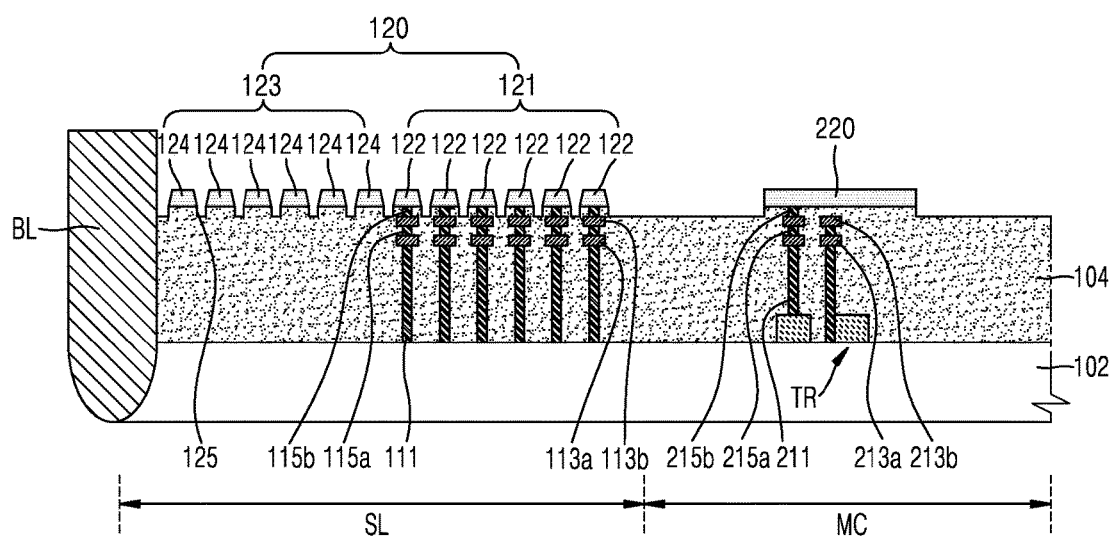

Referring to FIG. 13F, the die-sawing process is performed, and the semiconductor substrate 102 and various material layers formed on the semiconductor substrate 102 are cut by the saw blade BL. Then, the semiconductor device may be divided into a plurality of semiconductor chips. Each of the semiconductor chips may include the main chip area MC and the scribe lane area SL remaining on a peripheral portion of the main chip area MC.

Although FIGS. 13A to 13F illustrate that manufacturing processes performed on the scribe lane area SL and the main chip area MC are performed at the same time, the manufacturing processes on the scribe lane area SL and the main chip area MC may be performed separately.

The method of manufacturing the semiconductor device 100 is described above with reference to FIGS. 13A to 13F, but the semiconductor devices of various structures may be manufactured by modifying the descriptions provided with reference to FIGS. 13A to 13F within the technical scope of the inventive concept.

Figure 14A:
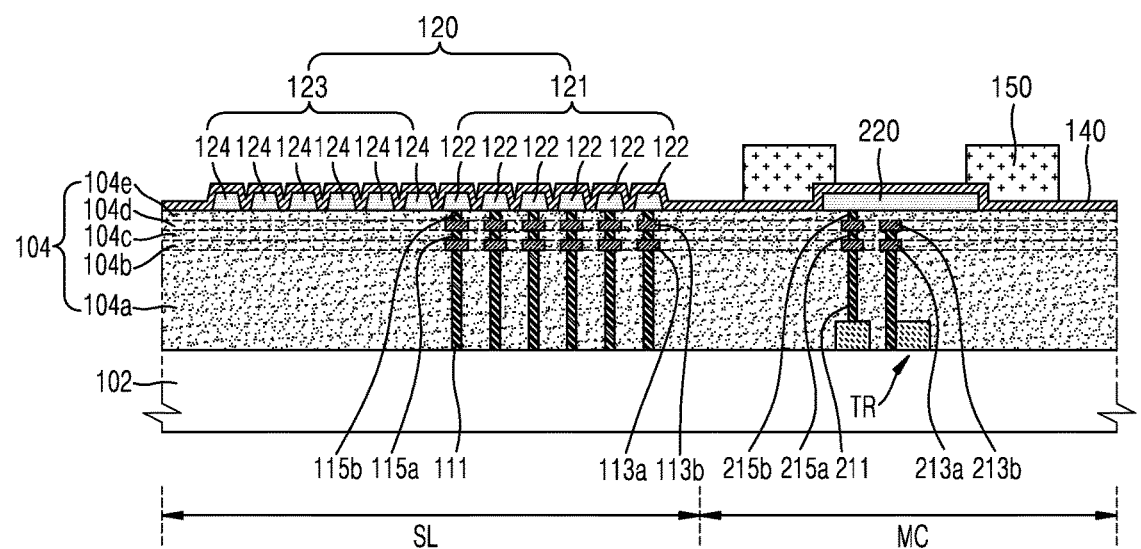
FIGS. 14A and 14B are cross-sectional views of a method of manufacturing a semiconductor device according to an exemplary embodiment.
Figure 14B:
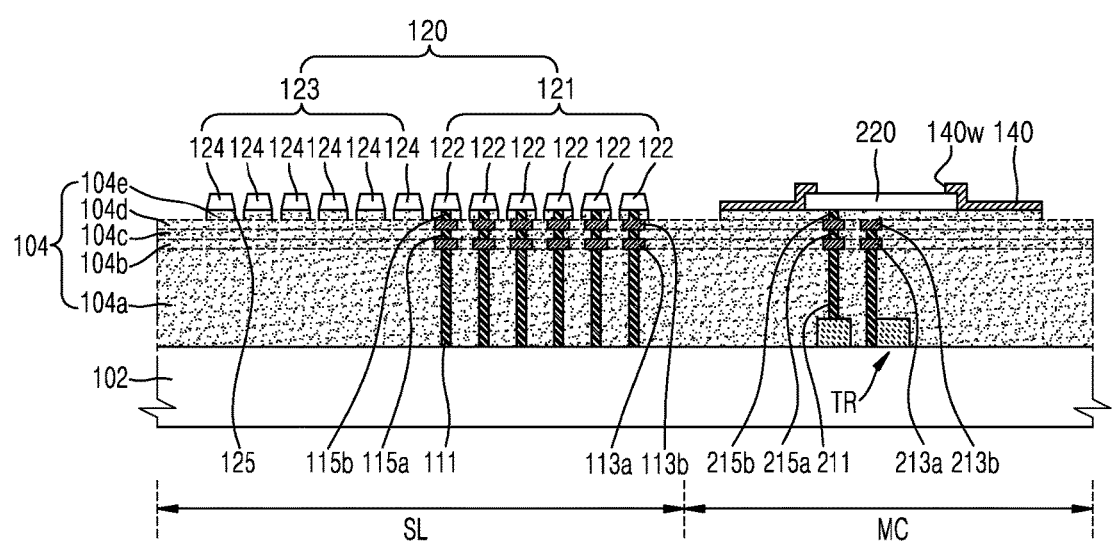

FIGS. 14A and 14B are cross-sectional views of a method of manufacturing a semiconductor device, according to an exemplary embodiment. FIGS. 14A and 14B show the scribe lane area SL and the main chip area MC in the semiconductor device.

Referring to FIG. 14A, the semiconductor device that has undergone the processes illustrated with reference to FIGS. 13A to 13D is prepared.

In addition, the passivation layer 140 covering the embossing pattern 120 and the landing pad 220 is formed on the insulating layer 104, and a mask layer 150 for exposing a part of the passivation layer 140 is formed on the passivation layer 140.

The mask layer 150 exposes a part of the passivation layer 140, where the embossing pattern 120 is formed, and a part of the passivation layer 140 on the landing pad 220.

The passivation layer 140 may include a material that is different from that of the insulating layer 104. For example, the passivation layer 140 may include a silicon nitride layer.

Referring to FIG. 14B, the passivation layer 140 exposed through the mask layer 150 and the insulating layer 104 under the passivation layer 140 may be etched by using the mask layer 150 and the embossing pattern 120 as an etching mask. In the scribe lane area SL, the insulating layer 104 is partially etched to form the trenches 125 by using the mask layer 150 and the embossing pattern 120 as the etching mask. In the main chip area MC, the passivation layer 140 exposed through the mask layer 150 is removed to form a pad window 140w exposing the landing pad 220. After that, the mask layer 150 may be removed.

In some exemplary embodiments for manufacturing the semiconductor device 100d illustrated with reference to FIGS. 12A and 12B, following processes may be performed.

After forming the passivation layer 140 on the insulating layer 104, a mask layer for exposing a part of the passivation layer 140 is formed on the passivation layer 140. Here, the mask layer may be only formed on at least a part of the embossing pattern 120.

Then, an etching process is performed by using the mask layer as an etching mask. As a result of the etching process, the passivation layer 140 exposed through the mask layer and a part of the insulating layer 104 under the passivation layer 140 are removed to form the trenches 125, and the passivation layer 140 covered by the mask layer and the insulating layer 104 under the passivation layer 140 may not be etched. After that, the mask layer may be removed.

Exemplary methods of manufacturing the semiconductor device according to one or more exemplary embodiments are described above, but one of ordinary skill in the art would appreciate that the semiconductor devices having various structures obtained through changes and modifications from the semiconductor devices illustrated with reference to FIGS. 1A to 12B may be manufactured by applying changes and modifications within the technical scope of the one or more exemplary embodiments.

Figure 15:
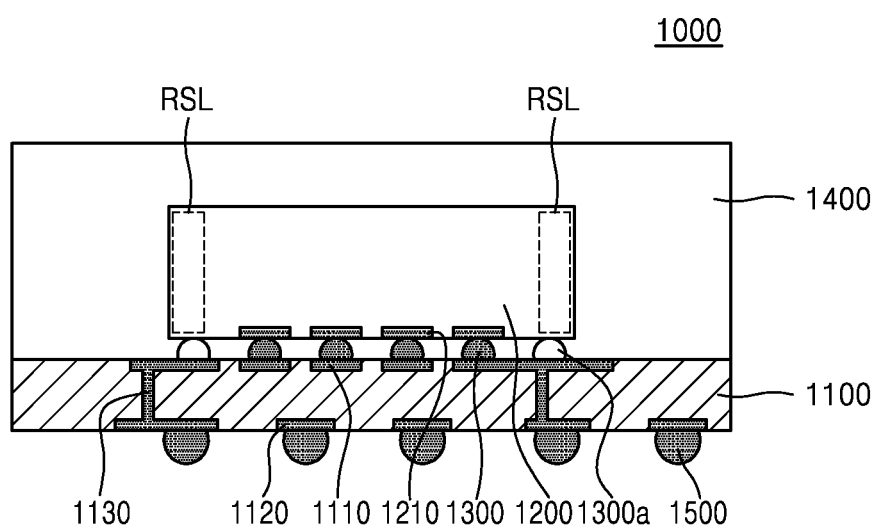
FIG. 15 is a cross-sectional view of a semiconductor package according to an exemplary embodiment.

FIG. 15 is a cross-sectional view of a semiconductor package 1000 according to an exemplary embodiment.

Referring to FIG. 15, the semiconductor package 1000 may include a package substrate 1100, a semiconductor chip 1200 mounted on a surface of the package substrate 1100, connection members 1300, a molding member 1400, and external connection members 1500. The semiconductor chip 1200 may be obtained by performing a die-sawing process with respect to the semiconductor device illustrated with reference to FIGS. 1A to 14B.

The package substrate 1100 may include an upper wiring layer 1110, a lower wiring layer 1120, and internal wires 1130 connecting the upper wiring layer 1110 and the lower wiring layer 1120 to each other. The upper wiring layer 1110 may be connected to a chip pad 1210 via the connection member 1300, and the lower wiring layer 1120 may be connected to the external connection member 1500. The upper wiring layer 1110, the lower wiring layer 1120, and the internal wires 1130 may function as a medium for electrically connecting the semiconductor chip 1200 mounted on the package substrate 1100 to an external device, together with the connection members 1300 and the external connection members 1500.

The semiconductor chip 1200 may include a main chip area on which a semiconductor device is formed on a center portion thereof, and a remaining scribe lane area RSL on a peripheral portion of the main chip area. Here, the remaining scribe lane area RSL may denote a scribe lane area that remains on the periphery of the main chip area after the die-sawing process is performed with respect to the semiconductor device on which integrated circuit devices are formed. A dam structure and/or an embossing pattern may be formed on the remaining scribe lane area RSL for preventing the crack from propagating toward the main chip area.

The semiconductor chip 1200 may be mounted on the surface of the package substrate 1100, and may be electrically connected to the package substrate 1100 via the connection members 1300 disposed between the package substrate 1100 and the semiconductor chip 1200. In some exemplary embodiments, the semiconductor chip 1200 may include a memory device, a logic device (e.g., a microprocessor, an analog processor, and a digital signal processor), or a system-on-chip for performing various functions. The memory device may include, for example, a dynamic random access memory (DRAM), a static RAM (SRAM), a flash memory, an electrically erasable and programmable read only memory (EEPROM), a parameter RAM (PRAM), a magnetic RAM (MRAM), or a resistive RAM (RRAM).

Otherwise, the semiconductor chip 1200 may be a multi-chip having a structure in which two or more semiconductor chips are stacked. For example, the two or more semiconductor chips may be memory devices of the same kind, or one of the two or more semiconductor chips may be a memory device and another may be a micro-controller device.

The connection members 1300 are formed on the upper wiring layer 1110 in order to electrically connect the semiconductor chip 1200 to the package substrate 1100. The connection member 1300 may include a conductive material, copper (Cu), aluminium (Al), solder, silver (Ag), tin (Sn), or gold (Au). For example, the connection member 1300 may be a bump including a solder ball, a solder bump, a metal pillar, and a solder, or a wire formed by a wire bonding device.

In some exemplary embodiments, the integrated circuit device may not be formed on the remaining scribe lane area RSL of the semiconductor chip 1200, and thus, the connection members 1300 may include dummy connection members 1300a disposed under the remaining scribe lane area RSL of the semiconductor chip 1200. However, in some other exemplary embodiments, the dummy connection members 1300a may be omitted.

The molding member 1400 may surround the semiconductor chip 1200 on the package substrate 1100. The molding member 1400 may include an epoxy-group molding resin or a polyimide-group molding resin.

According to the semiconductor chip 1200 of the one or more exemplary embodiments, the propagation of the crack generating in the scribe lane area toward the main chip area during the die-sawing process may be prevented, and thus, degradation in reliability of the integrated circuit due to the crack may be prevented. Moreover, since the semiconductor chip 1200 includes the dam structure and/or the embossing pattern on the remaining scribe lane area RSL, damage to the integrated circuit in the main chip area due to the stress that may be applied to the semiconductor chip 1200 during assembling the semiconductor package 1000 may be prevented.

While exemplary embodiments have been particularly shown and described, it will be understood that various changes in form and details may be made therein without departing from the spirit and scope of the following claims.

What is claimed is:

1. A semiconductor device comprising:
a semiconductor substrate comprising a main chip area and a scribe lane area adjacent to the main chip area, the scribe lane area comprising a first region adjacent to the main chip area and a second region adjacent to the first region;
an insulating layer disposed on the semiconductor substrate;
first embossing structures disposed on a first surface of the insulating layer in a first area of the insulating layer corresponding to the first region of the scribe lane area;
second embossing structures disposed on the first surface of the insulating layer in a second area of the insulating layer corresponding to the second region of the scribe lane area; and
dam structures provided in the first area of the insulating layer at positions corresponding to the first embossing structures, the dam structures extending in a first direction perpendicular to a second surface of the insulating layer that is adjacent to the semiconductor substrate,
wherein each of the first embossing structures have a first shape, each of the second embossing structures have a second shape, and the first shape is different from the second shape.

2. The semiconductor device of claim 1, wherein each dam structure is provided at a position directly below a corresponding first embossing structure.

3. The semiconductor device of claim 1, wherein each the first embossing structures have a bar shape, each of the second embossing structures have a dot shape, and the first embossing structures are larger than the second embossing structures.

4. The semiconductor device of claim 1, wherein the dam structures extend from the second surface of the insulating layer to the first embossing structures.

5. The semiconductor device of claim 4, wherein each of the dam structures comprises:
at least one dummy wiring layer extending in a second direction parallel to the second surface of the insulating layer;
at least one dummy via extending from the at least one dummy wiring layer to a corresponding first embossing structure; and
a dummy via contact extending from the second surface of the insulating layer to the at least one dummy wiring layer.

6. The semiconductor device of claim 5, wherein the at least one dummy wiring layer comprises a first dummy wiring layer and a second dummy wiring layer extending in the second direction parallel to the second surface of the insulating layer, and
wherein the at least one dummy via comprises:
a first dummy via connecting the first dummy wiring layer to the second dummy wiring layer; and
a second dummy via connecting the second dummy wiring layer to the corresponding first embossing structure.

7. The semiconductor device of claim 1, wherein at least one of the dam structures is spaced apart from a corresponding first embossing structure in a thickness direction of the insulating layer.

8. The semiconductor device of claim 7, wherein the dam structures comprise:
first dam structures extending from the second surface to the first embossing structures; and
second dam structures extending from the second surface of the insulating layer and spaced apart from the first embossing structures in the thickness direction of the insulating layer.

9. The semiconductor device of claim 1, further comprising at least one guard ring structure arranged between the dam structures and the main chip area, the at least one guard ring structure comprising:
at least one dummy wiring layer extending in a second direction parallel to the second surface of the insulating layer;
at least one dummy via extending from the at least one dummy wiring layer to a corresponding first embossing structure; and
a dummy via contact extending from the second surface of the insulating layer to the at least one dummy wiring layer.

10. The semiconductor device of claim 1, wherein trenches are provided in the first surface of the insulating layer between adjacent ones of the first embossing structures and between adjacent ones of the second embossing structures.

11. The semiconductor device of claim 1, wherein the first embossing structures and the second embossing structures are arranged in lines that are parallel to a side edge of the main chip area.

12. The semiconductor device of claim 11, wherein the second embossing structures are arranged in a matrix, and
the first embossing structures arranged in a first line are offset from the first embossing structures arranged in a second line in a direction of the first line and the second line.

13. The semiconductor device of claim 11, wherein the second embossing structures arranged in a first line are offset from the second embossing structures arranged in a second line in a direction of the first line and the second line.

14. A semiconductor device comprising:
a semiconductor substrate comprising a main chip area and a scribe lane area adjacent to the main chip area;
an insulating layer disposed on the semiconductor substrate;
embossing structures disposed on a first surface of the insulating layer in an area of the insulating layer corresponding to the scribe lane area; and
wherein trenches are provided in the first surface of the insulating layer between adjacent ones of the embossing structures, and the trenches have a depth that is less than a thickness of the insulating layer.

15. The semiconductor device of claim 14, wherein a bottom surface of each of the trenches is has a rounded shape.

16. The semiconductor device of claim 15, wherein a first width of the embossing structures is greater than a second width of the trenches.

17. A semiconductor device comprising:
a semiconductor substrate comprising a main chip area and a scribe lane area adjacent to the main chip area, the scribe lane area comprising a first region adjacent to the main chip area and a second region adjacent to the first region;

an insulating layer disposed on the semiconductor substrate;

first embossing structures disposed on a first surface of the insulating layer in a first area of the insulating layer corresponding to the first region of the scribe lane area; and second embossing structures disposed on the first surface of the insulating layer in a second area of the insulating layer corresponding to the second region of the scribe lane area, wherein each of the first embossing structures have a first shape, each of the second embossing structures have a second shape, and the first shape is different from the second shape.

18. The semiconductor device of claim 17, further comprising a passivation layer formed on the insulating layer and at least partially covering the first embossing structures and the second embossing structures.

19. The semiconductor device of claim 17, wherein the first embossing structures and the second embossing structures are made of a conductive material.

* * * * *